United States Patent [19]
Niwa

[11] Patent Number: 5,886,389
[45] Date of Patent: *Mar. 23, 1999

[54] FIELD-EFFECT TRANSISTOR AND METHOD FOR PRODUCING THE SAME

[75] Inventor: Masaaki Niwa, Osaka, Japan

[73] Assignee: Matsushita Electric Industrial Co., Ltd., Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 655,561

[22] Filed: May 30, 1996

[30] Foreign Application Priority Data

May 31, 1995 [JP] Japan ................................. 7-133346

[51] Int. Cl.$^6$ ................................................. H01L 29/76
[52] U.S. Cl. .................................... 257/401; 257/623
[58] Field of Search ................................. 257/401, 618, 257/623, 628

[56] References Cited

U.S. PATENT DOCUMENTS

| | | | |
|---|---|---|---|
| 5,422,306 | 6/1995 | Niwa et al. | 437/132 |
| 5,480,492 | 1/1996 | Udagawa et al. | 156/643.1 |

FOREIGN PATENT DOCUMENTS

| | | |
|---|---|---|
| 05243266 | 9/1993 | European Pat. Off. . |
| 63-111630 | 5/1988 | Japan . |
| 64-1273 | 1/1989 | Japan . |
| 5-243266 | 9/1993 | Japan . |
| 5-308070 | 11/1993 | Japan . |
| 6-151395 | 5/1994 | Japan . |
| 08264401 | 10/1996 | Japan . |
| 08264402 | 10/1996 | Japan . |
| 8-264780 | 10/1996 | Japan . |

OTHER PUBLICATIONS

M. Niwa et al., "SiO$_2$/Si Interfaces Studied by Scanning Tunneling Microscopy and High Resolution Transmission Electron Microscopy", *J. Electrochem. Soc.*, vol. 139, No. 3, pp. 901–906, (Mar. 1992).

T. Sato et al., "Mobility Anisotropy of Electrons in Inversion Layers on Oxidized Silicon Surfaces", *Physical Review B.*, vol. 4, No. 6, pp. 1950–1960, (Sep. 1971).

J. Chung et al., "The Effects of Off–Axis Substrate Orientation on MOSFET Characteristics", Department of Electrical Engineering and Computer Sciences, University of California, pp. 26.6.4, Mar. 12, 1989.

*Primary Examiner*—Mark V. Prenty
*Attorney, Agent, or Firm*—Ratner & Prestia

[57] ABSTRACT

A field-effect transistor includes a semiconductor substrate including a source region, a drain region and a channel region located between the source and drain regions; a gate insulating film formed on at least the channel region of the semiconductor substrate; and a gate electrode formed on the gate insulating film. The surface the semiconductor substrate includes a plural of terraces having crystallographically smooth planes and at least one step located in a boundary portion of the plurality of terraces. The step extends substantially along a channel length direction.

10 Claims, 9 Drawing Sheets

FIELD-EFFECT TRANSISTOR AND METHOD FOR PRODUCING THE SAME

BACKGROUND OF THE INVENTION

1. Field of the Invention

The present invention relates to a field-effect transistor having a hyper-smooth face and a method for producing the same.

2. Description of the Related Art

In recent years, smoothing of hetero-interfaces has been energetically studied for the next generation electronic devices such as a further miniaturized MOS transistor and a quantum effect device.

Hereinafter, the hetero-interfaces of a conventional MOS field-effect transistor will be described with reference to the accompanying drawings. In the specification of the present invention, "MOS" is not limited to a three-layer structure consisting of metal-oxide film-semiconductor, but includes a three-layer structure of conductor-insulating film-semiconductor.

FIGS. 4A through 4C are cross sectional views illustrating a process of forming a conventional interface between silicon and an oxide film.

FIG. 4A shows a cross section of a silicon substrate 70 before formation of a gate insulating film in a MOS field-effect transistor. Typically, general, a processed layer (thickness: about 100 nm to 500 nm) damaged in various processes such as slicing or polishing is formed at the surface of the silicon substrate. The processed layer is removed by forming a thermal oxide film on the surface of the silicon substrate by wet oxidation, and treating the thermal oxide film with a hydrofluoric acid or the like. Before the wet oxidation, the silicon substrate is subjected to RCA cleaning in order to remove organic contamination from the surface of the silicon substrate. FIG. 4A shows the state of the surface of the silicon substrate 70 immediately after the thermal oxide film has been removed.

However, wet oxidation is not suitable for forming a very thin gate insulating film since the resulting oxidation rate is too fast. For this reason, it is apparently advantageous to perform dry oxidation where thermal oxidation is performed with a dry ambient gas in order to form the very thin gate insulating film. However, it is reported that the gate insulating film obtained by the dry oxidation presents problems of a low withstand voltage for insulation. It is believed that such deterioration of the withstand voltage is due to concaves and convexes at the interface between the gate insulating film and the silicon substrate (e.g., M. Niwa et al, J. Electrochem. Soc., 139(1992)901).

Next, as shown in FIG. 4B, a gate insulating film 71 (thickness: 10 nm) is formed by dry oxidation. The dry oxidation is performed by heating the silicon substrate 70 to about 900° C. with a dry oxygen gas in an electric furnace. Furthermore, in order to remove oxide film defects such as pin holes from the gate insulating film 71, the silicon substrate 70 is subjected to an annealing treatment at 950° C. with a dry nitrogen gas for 20 min.

Although all the mechanisms responsible for formation of concaves and convexes at the interface 72 between the gate insulating film 71 and the silicon substrate 70 have not been fully determined at present, it is believed that the size of the oxidizing species and the silanol group of the oxide film are significant factors in the formation of concaves and convexes.

$O_2$ has a larger size than that of $H_2O$. In addition, a silanol group which can function as a structure relaxation agent is not present in the dry $O_2$ gas. As a result, the oxidizing species ($O_2$) is not randomly (uniformly) bonded with silicon atoms located on the silicon surface, but the oxidizing species is believed to enter from a (111) facet face having a longest net bond length into the inside portion and reacts with silicon atoms there. Accordingly, in the case of dry oxidation, a path for introducing the oxidizing species is formed in a specific portion on the surface of the silicon, and oxidation proceeds from the path before other portions. For this reason, when dry oxidation is performed, concaves and convexes are easily formed at the interface between the oxide film and the silicon substrate.

In the present examples, since the oxide film formed by the dry oxidation has a debye length of 15 nm, an initial process region of oxidation whose mechanisms have not all yet been fully determined, and a final phase of forming the film (i.e., forming the oxide film) in the vicinity of the silicon/oxide film interface is performed according to the Deal-Grove reaction mechanism.

For the reason described above, it is understood that the relatively large concaves and convexes on the surface of the silicon substrates shown in FIG. 4B are formed as a result of the oxidizing species entering from an easy access (i.e., the path such as the (111) facet) and the reaction with the silicon atoms being promoted.

As shown in FIG. 4A, relatively small concaves and convexes are present on the surface of the silicon substrate 70 before the dry oxidation, and various fine crystalline planes appear on the surface. Since oxidation rate on the crystalline planes are varied with plane directions, the interface 72 between the oxide film and the silicon substrate has a complex surface profile obtained as a result of combining the large concaves and convexes and the small ones.

After the gate insulating film is formed, as shown in FIG. 4C, a polysilicon layer 73 for functioning as a gate electrode is deposited on the gate insulating film 71 to form a MOS structure. An rms value of the concaves and convexes at the interface between the insulating film and the silicon substrate formed in such a manner is about 1.5 nm, according to a cross sectional observation through a transmissive electronic microscope.

However, in the above-mentioned structure, the concaves and convexes at the interface adversely causes electrons travelling in an inversion layer to be scattered, resulting in restriction of the operation speed of a device. When a MOS field-effect transistor is produced using the above-mentioned MOS structure and operated, an inversion layer 74 is formed in a portion approximate to the gate oxide film 71 in the silicon substrate 70 (i.e., in the vicinity of the surface of the silicon substrate 70). A high electric field is formed in the inversion layer 74, and electrons 75 in the inversion layer 74 travel in the inversion layer 74 at a high speed. At this point, the electrons 75 are scattered by the concaves and convexes on the surface of the silicon, resulting in reduction of field-effect mobility of the electrons.

SUMMARY OF THE INVENTION

A field-effect transistor according to the present invention includes a semiconductor substrate including a source region, a drain region and a channel region located between the source and drain regions; a gate insulating film formed on at least the channel region of the semiconductor substrate; and a gate electrode formed on the gate insulating film. The surface of the semiconductor substrate includes a plurality of terraces having crystallographically smooth planes and at least one step located in a boundary portion of the plurality of terraces. The step extends substantially along a channel length direction.

In one embodiment of the invention, the source region, the channel region and the drain region are located such that a charge generated in the channel region moves along the channel length direction of the semiconductor substrate during operation.

In another embodiment of the invention, 50% or more of the steps consist of step A.

In still another embodiment of the invention, the semiconductor substrate is a (001) silicon substrate having a misorientation angle with a value except 0.

In yet another embodiment of the invention, the misorientation angle is in a range greater than 0 and less than 4 degrees.

In another embodiment of the invention, the number of the steps which cross the channel region is 20 or less.

In still another embodiment of the invention, the dimer arrays extending in the channel length direction are formed on each of the plurality of terraces.

In yet another embodiment of the invention, the steps substantially consist of step A.

In another embodiment of the invention, the semiconductor substrate is a (001) silicon substrate having a misorientation angle in a range of greater than 4 degrees and less than 15 degrees.

In still another embodiment of the invention, the channel region is a quantum fine line formed on a shoulder portion of the step, and a width of the quantum fine line is 10 nm or less.

In another embodiment of the invention, dimer arrays are formed on an arbitrary terrace of the plurality of terraces to be orthogonal to dimer arrays formed on a terrace adjacent to the arbitrary terrace.

In still another embodiment of the invention, the semiconductor substrate is formed of silicon, and the gate insulating film is formed of a thermal oxide film.

In yet another embodiment of the invention, the thermal oxide film has a thickness of 4 nm or less.

In another embodiment of the invention, a upper face of the thermal oxide film has a shape identical to that of a lower face of the thermal oxide film.

According to another aspect of the invention, a method for producing a field-effect transistor including: a semiconductor substrate including a source region, a drain region and a channel region located between the source and drain regions; a gate insulating film formed on at least the channel region of the semiconductor substrate; and a gate electrode formed on the gate insulating film includes the steps of treating the surface of the semiconductor substrate to form a plurality of terraces having crystallographically smooth planes and at least one step located in a boundary portion of the plurality of terraces; forming the gate insulating film on the surface of the semiconductor substrate; forming the gate electrode on the gate insulating film; and forming the source region and the drain region in the semiconductor substrate so that the step extends substantially along a channel length direction.

In one embodiment of the invention, the surface-treating step includes the step of heating the semiconductor substrate in a vacuum.

In another embodiment of the invention, the surface-treating step includes the step of heating the semiconductor substrate to a temperature of 1000° C. or higher.

In still another embodiment of the invention, the step of forming the gate insulating film includes the step of thermally oxidizing the surface of the semiconductor substrate.

In yet another embodiment of the invention, a step of providing a device isolation structure in the semiconductor substrate is further included after the surface-treating step.

In another embodiment of the invention, a (001) silicon substrate having a misorientation angle with a value except 0 is used for the semiconductor substrate.

In still another embodiment of the invention, the misorientation angle is in a range of greater than 0 and less than 4 degrees.

In yet another embodiment of the invention, the step has a height equivalent to the thickness of a silicon monoatomic layer.

In another embodiment of the invention, the misorientation angle is greater than 4 degrees.

In still another embodiment of the invention, the step has a height greater than the thickness of a silicon monoatomic layer.

According to another aspect of the invention, a method for smoothing steps on a semiconductor substrate includes the steps of: forming a semiconductor substrate including a plurality of terraces and steps located at boundary portions between the plurality of terraces; and smoothing roughness at the boundary portion by oxidizing the surface of the semiconductor substrate to reduce a size of a projection projecting from the boundary portion of the steps parallel to the semiconductor substrate.

In one embodiment of the invention, the projection has a size of 8 nm or less.

Thus, the invention described herein makes possible the advantages of (1) providing a field-effect transistor having improved device characteristics by restricting the interface scattering of the travelling electrons; and (2) providing a method for producing such a field-effect transistor.

These and other advantages of the present invention will become apparent to those skilled in the art upon reading and understanding the following detailed description with reference to the accompanying figures.

DESCRIPTION OF THE PREFERRED EMBODIMENTS

Hereinafter, a field-effect transistor of the present invention will be described by way of examples below with reference to the accompanying drawings.

EXAMPLE 1

In this Example, the field-effect transistor has an insulating layer/semiconductor interface having planeness on atomic scale.

Figure 1A:
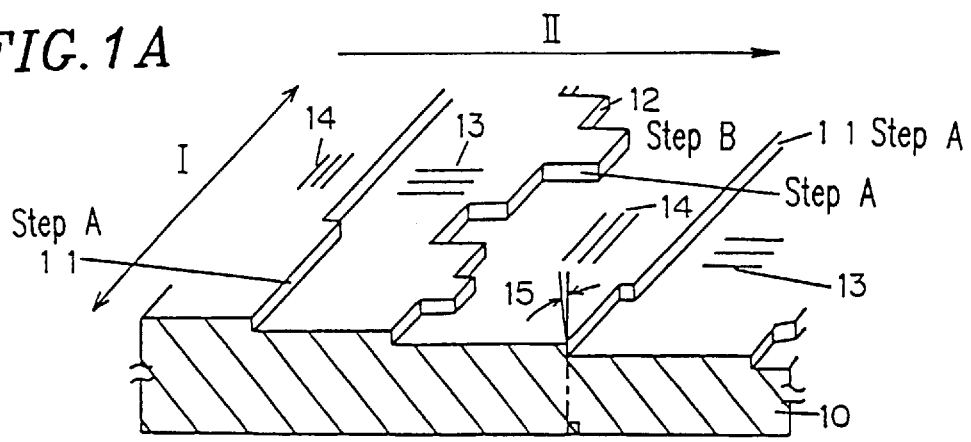
FIGS. 1A, 1B and 1C are schematic views illustrating a method for forming the hetero-interface of a metal-insulator-semiconductor field-effect transistor in the first embodiment of the present invention.

FIG. 1A is a perspective view of a (001) clean surface formed by vacuum heat-cleaning or homoepitaxial growth of silicon. As shown in FIG. 1A, a surface of a silicon substrate 10 includes a plurality of steps and a plurality of terraces. The top face of each terrace is a (001) plane and smooth on a microscopic (atomic level) scale. In the specification of the present invention, such a smooth plane may be referred to as a "crystallographically smooth plane".

The above-mentioned surface structure is formed by a vacuum heat-cleaning technique or homoepitaxial growth technique. These techniques will be described in detail later.

Figure 1B:
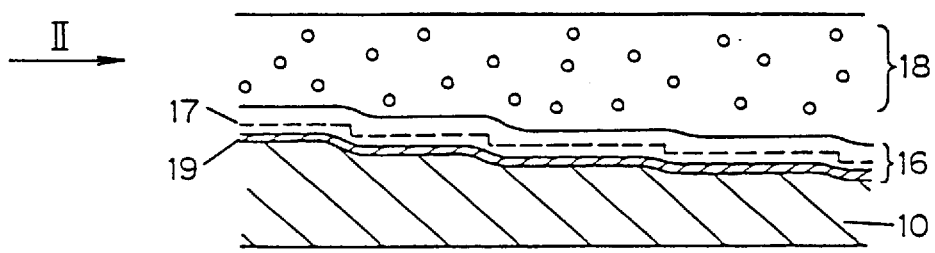

In the surface of the silicon substrate 10, each step is formed in a boundary portion of two adjacent terraces. In other words, a terrace of a relatively high level (upper terrace) and a terrace of a relatively low level (lower terrace) are adjacent with a step therebetween. In this example, as shown in FIG. 1B, the level of the terrace is gradually lowered in a direction II. In other words, the surface of the silicon substrate 10 inclines from the (001) plane on a macroscopic scale. The silicon substrate 10 having such a structure is prepared using a misoriented substrate. In this example, a silicon substrate (p-type impurity (boron) concentration: about $10^{15} cm^{-3}$) having a misorientation angle 15 of 2 degrees is used.

Still referring to Example 1, a height of each step is about 0.136 nm corresponding to a thickness of a silicon monoatomic layer. A size of each terrace measured in a direction I is about 10 to 20 nm.

Figure 1C:
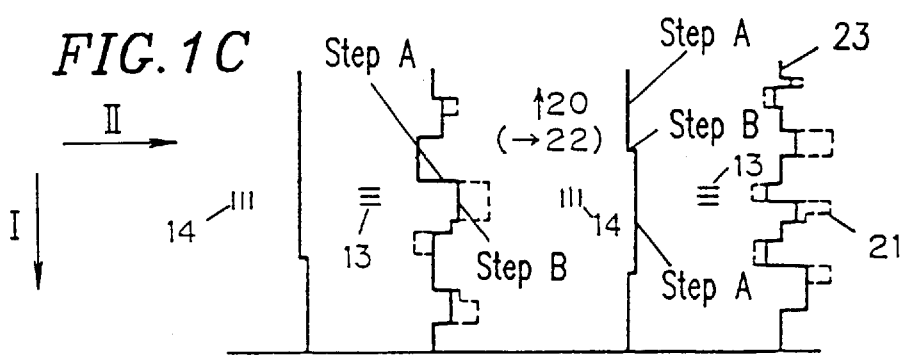

As shown in FIG. 1C, the number of steps crossing a line parallel to direction I is substantially less than the number of steps crossing a line parallel to direction II. Thus, the steps extend straight along direction I on a macroscopic scale. In other words, on the silicon substrate 10 of this example, the terraces having smooth planes extend along the direction I. In the specification, the direction I may be referred to as "step direction".

Next, the relationship between the steps and the terraces will be described. Silicon atoms located on the uppermost surface of each terrace form atomic arrays (dimer arrays) consisting of dimers. The dimer arrays include a first dimer array 14 extending along a first direction and a second dimer array 13 extending along a second direction perpendicular to the first direction. The dimer arrays of one type are formed in one terrace. The steps are classified into two types, i.e, step A 11 and step B 12 depending on the orientation. As shown in FIG. 1C, the step A 11 is a step parallel to dimer arrays formed on the upper terrace, while the step B 12 is a step perpendicular to a dimer array formed on the upper terrace. In this example, as shown in FIG. 1C, a terrace structure is formed such that the dimer arrays 13 and 14 are alternately located. Either one of the dimer arrays 13 and 14 may be formed on the surface depending on a misorientation angle of the silicon substrate (see Example 2).

Next, a process of forming the silicon substrate 10 having such a surface structure as shown in FIG. 1A will be described in detail.

First, RCA cleaning is performed on the silicon substrate in order to remove organic substances from the surface of the silicon substrate. Next, a thermal oxide film is formed on the surface of the silicon substrate by wet oxidation, and then the thermal oxide film is removed with a hydrofluoric acid or the like. By such a treatment, a "processed layer" is removed. In this stage, fine concaves and convexes are irregularly present on the surface of the silicon substrate.

Next, the silicon substrate is placed in an ultra-high vacuum chamber, and then the pressure in the chamber is reduced to about 4 to $6 \times 10^{-9}$ Pa. Then, the silicon substrate is rapidly heated by a rapid thermal annealing method to raise the temperature to 1150 to 1250° C. for about 1 to 5 seconds. Thereafter, the temperature is gradually lowered to room temperature. During the cooling process, silicon on the surface of the silicon substrate is rearranged to form a (2×1) structure. When the main surface of the silicon substrate is off the (001) plane, a structure having a plurality of plane terraces with steps is formed. When the silicon substrate is retrieved from the chamber, oxygen molecules in the air are attached on the surface of the silicon substrate to form a thin air oxide film on the surface.

The above-mentioned method is referred to as a heat cleaning method. Even when the silicon substrate is heated by being irradiated with UV rays in an oxygen gas in place of heating under a vacuum, the (2×1) structure can be formed. These surface treatment methods are disclosed in Japanese Laid-Open Patent Publication Nos. 5-243266 and 6-151395.

Furthermore, the structure having a plurality of plane terraces with steps may be formed on the surface of the silicon substrate by providing an epitaxial growth layer on the off substrate using a homoepitaxial growth technique. In the specification of the present invention, such a homoepitaxial growth process is included in the "surface treatment process".

After the silicon substrate 10 having a surface structure as shown in FIG. 1A is prepared in the above-mentioned manner, the surface of the silicon substrate 10 is subjected to thermal oxidation. In the case where a native oxide film is formed on the surface of the silicon substrate 10, the native oxide film is preferably removed as much as possible. The thermal oxidation is performed by dry oxidation. More specifically, the silicon substrate 10 is heated to about 900° C. with a dry oxygen gas in an electric furnace so that an oxide film 16 having a thickness of 5 nm is formed on the surface of the silicon substrate 10. Following the thermal oxidation, the silicon substrate 10 is subjected to an annealing treatment at 950° C. using a dry nitrogen gas for 20 minutes in order to remove oxide film defects such as pin holes.

During the course of the thermal oxidation, the oxide film/silicon interface moves into the deep portion of the silicon substrate 10. In general, as the thermal oxide film becomes thick, the oxidation mechanism is changed: starting with the initial process, changing into the reaction-controlled mechanism and then the diffusion-controlled mechanism. However, in this example, since the thickness of the oxide film is very thin, the formation of the oxide film is completed in the initial process.

According to this example, since the surface of the silicon substrate 10 is constructed by atomically plane surfaces, i.e., (001) terrace surfaces, a specific path for introducing an oxidizing species is unlikely to be generated, whereas it is conventionally generated. For this reason, since the oxidizing species is uniformly reacted with a silicon atom on the surface of the silicon, irregular concaves and convexes are unlikely to be formed at the oxide film/silicon interface, compared with the conventional example.

By such thermal oxidation, the oxide film 16 having a surface profile in accordance with a step shape 17 on the surface of the silicon substrate 10 is formed before the thermal oxidation is completed. This means that the thermal oxidation uniformly proceeds regardless of the position on the surface, resulting in the formation of an oxide film having a uniform thickness regardless of the position. The phenomenon that the surface profile of the oxide film 16 preserves the step shape 17 of the underlying silicon is more conspicuous when the oxide film 16 becomes thinner. When a thermal oxide film having a thickness of about 4 nm or less is formed by a conventional method, the thickness of the thermal oxide film is not uniform and locally too thin in some portions. As a result, insulation breakdown is likely to occur at the thin portions. On the other hand, according to the present invention, a thin thermal oxide film is advantageously formed to have a uniform thickness. Therefore, in the case where the thermal oxide film is to be formed with a thickness of about 4 nm or less, the method of the present invention provides a particularly remarkable advantage.

From the experiments carried out by the inventors, it is found out that the length and the number of steps parallel to the direction II are reduced by thermal oxidation. Thus, the present invention provides a particularly preferable effect in the case where the thermal oxide film is used as a gate insulating film.

Next, polysilicon 18 (thickness: 200 nm) for functioning as a gate electrode is deposited on the oxide film 16 to form a MOS structure. When a voltage of a predetermined value is applied to the gate electrode, a thin inversion layer 19 (thickness: 4 nm) is formed in the silicon substrate at the oxide film/silicon interface. More specifically, electrons in the inversion layer are distributed such that a peak is in the position about 0.4 nm deep from the oxide film/silicon interface.

In order to produce a MOS field-effect transistor, it is necessary to form a source region, a drain region and a channel region in the vicinity of the surface of the silicon substrate 10. According to the present invention, the source region and the drain region (n-type impurity concentration: $10^{20} cm^{-3}$) are formed such that the traveling direction of the electrons in the inversion layer is aligned with the direction of the arrow 20 shown in FIG. 1C, The source region and the drain region are not shown in FIG. 1C.

Figure 5:
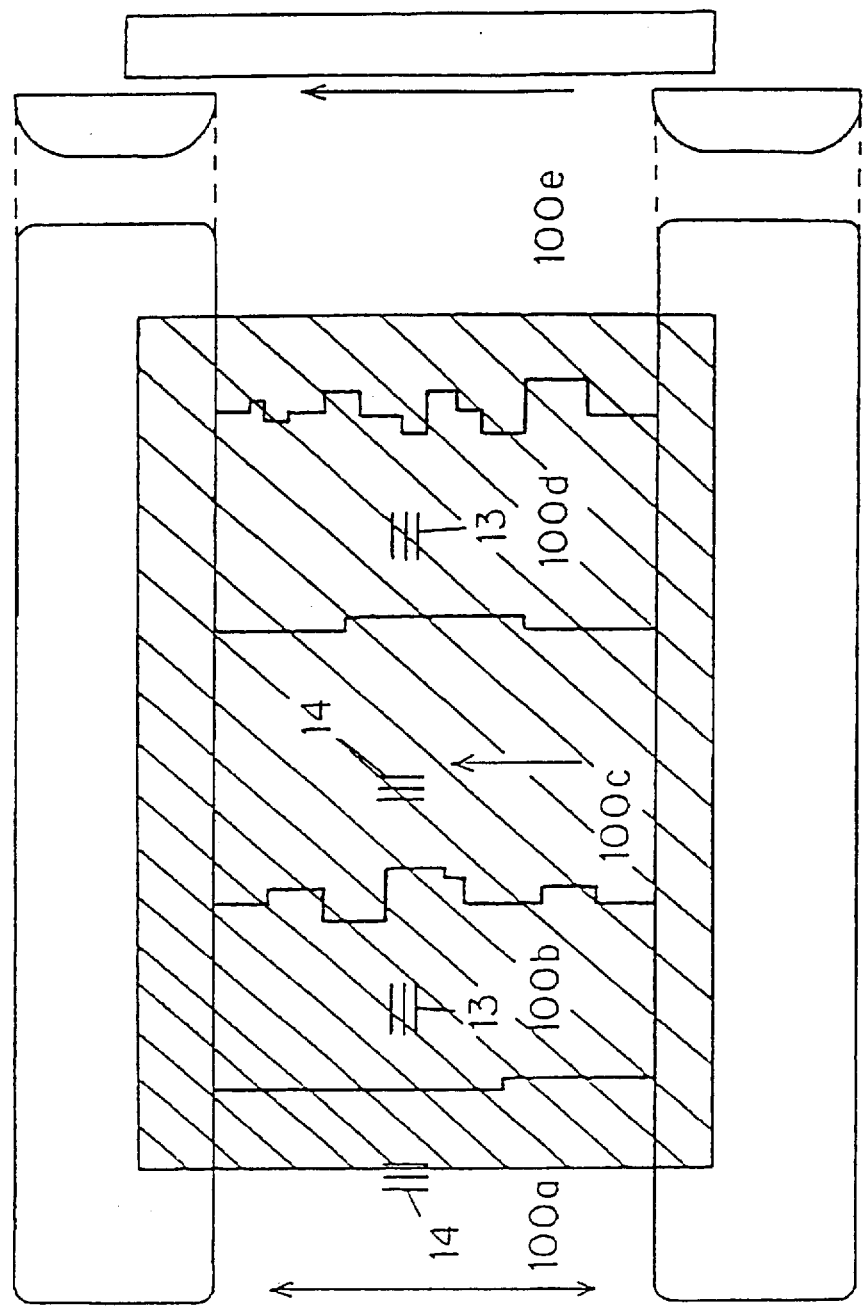
FIG. 5 is a plan view showing a structure of a MOS field-effect transistor of the present invention.

FIG. 5 shows the arrangement relationship between the step structure on the silicon surface and the source region and the drain region in the MOS field-effect transistor. In this example, the step direction is parallel to the traveling direction of electrons.

Among terraces 100a to 100e in FIG. 5, for example, electrons traveling from the source region toward the drain region in the terrace 100c are scattered in a step in the side of the terrace 100b (in particular, a portion projecting from the boundary portion between the terrace 100b and the terrace 100c in the direction perpendicular to the step direction). However, since the projecting step has a size corresponding to a thickness of merely several atomic layers, mobility of the electrons is not significantly reduced. Needless to say, however, it is preferable to reduce the size and the number of steps projecting from the upper terrace to the lower terrace, because the reduced size and number suppresses the scattering of the electrons.

In the vicinity of step A, the electrons travel substantially without being scattered, whereas in the vicinity of step B, it is expected that the electrons are easily scattered due to a complex two-dimensional shape thereof. However, after oxidation, the complex surface profile of the step B becomes like the oxide film interface surface profile 23 shown in FIG. 1C, which is less non-uniform than a surface profile 21 before oxidation indicated by a broken line. As a result, the frequency of two-dimensional concaves and convexes at the oxide film interface with respect to the traveling direction 20 of the electrons tends to be reduced.

Since a height of each step corresponds to a thickness of a monoatomic layer on the silicon (001) plane, the size of the concaves and convexes along the direction perpendicular to the surface of the silicon substrate (depth direction) is 0.36 nm at most. As a result, the traveling electrons are not significantly exposed to this kind of roughness.

On the other hand, in the case where electrons are allowed to travel in the direction (direction of arrow 22) perpendicular to the step direction (direction of arrow 20), the electrons travel being constantly exposed to the step-shaped roughness resulting from the monoatomic steps. As a result, the scattering probability is larger compared to the case where electrons travel in the step direction.

Figure 1D:
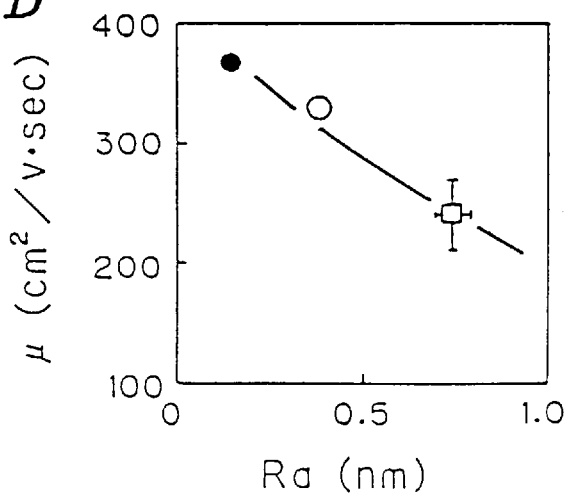
FIG. 1D shows measurement results of roughness at the oxide film/silicon interface and electron mobility (field-effect mobility $\mu_e$ of electrons) in the inversion layer at room temperature in the case where the thermal oxide film has a thickness of 5 nm.

FIG. 1D shows measurement results of roughness at the oxide film/silicon interface and electron mobility (field-effect mobility $\mu_e$ of electrons) in the inversion layer at room temperature in the case where the thermal oxide film has a thickness of 5 nm.

The results obtained by using a method for forming a hetero-interface according to the present invention are shown in comparison with a method for forming an interface by ordinary wet cleaning. In FIG. 1D, a square indicates the case where Si(001) surface is treated by the wet cleaning; a white circle indicates the case where vacuum heat cleaning is performed, an Si(001)–2×1 rearranged surface is subjected to thermal oxidation and electrons are allowed to travel in a direction toward the larger step height (corresponding to the direction 22 in FIG. 1C); and a black circle indicates the case where vacuum heat cleaning is performed, an Si(001)–2×1 rearranged surface is subjected to thermal oxidation, and electrons are allowed to travel in a direction toward the smaller step height (corresponding to the direction 20 in FIG. 1C). In the case where the 2×1 rearranged surface is subjected to thermal oxidation, the mobility is significantly improved as compared to the case where the wet cleaned surface is oxidized.

In the case where the 2×1 rearranged surface is subjected to thermal oxidation and electrons are allowed to travel in the direction to a smaller step, it is confirmed that the electron mobility is further improved.

Although the above-mentioned results are obtained by measurements at room temperature, the improvement is more conspicuous in the case where the substrate temperature is lowered, because phonon scattering is suppressed and traveling electrons are thus pushed away to the interface portion.

As described above, according to the present invention, in arranging the source and the drain opposed thereto, a traveling direction of electrons in the inversion layer is parallel to a direction to which steps run so that it is possible to reduce electron scattering at the silicon/oxide film interface portion. Thus, the scattering at the interface can be suppressed without using a substrate having a small misorientation angle 15. In this manner, the reduction in the mobility at the interface due to the silicon/oxide film interface roughness scattering can be suppressed under the high intensity of a vertical electric field.

Although the aforementioned description is directed to the case where a plane direction of the surface of the silicon substrate is (001), the same is true for other plane directions. Namely, in the case of a silicon (111) plane and in the case where a step size is large as shown in Example 2 of the present invention, the effects of the present invention are more remarkably presented.

Although the field-effect transistor using the silicon substrate has been described in this example, the present invention is applicable to a field-effect transistor using, for example, a GaAs substrate. In addition, the misorientation angle 15 is set to 2 degrees in this example, but the misorientation angle 15 is preferably in the range of greater than 0 and less than 4 degrees in order to obtain the steps shown in FIG. 1A.

EXAMPLE 2

Hereinafter, a second example of a field-effect transistor according to the present invention will be described with reference to the accompanying drawings.

Figure 2A:
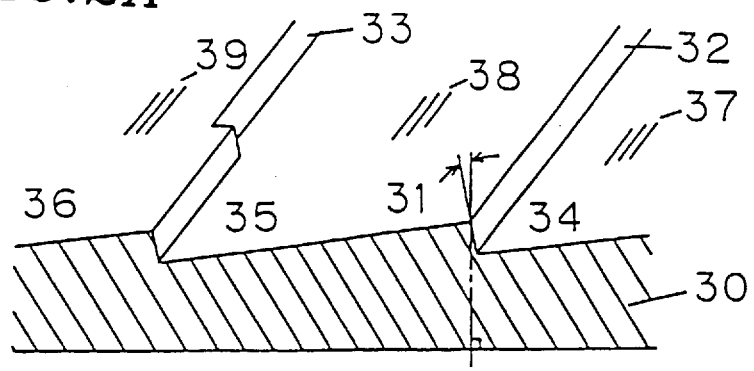
FIGS. 2A, 2B and 2C are schematic views illustrating a structure of the metal-insulator-semiconductor field-effect transistor in the second embodiment of the present invention.
Figure 2B:
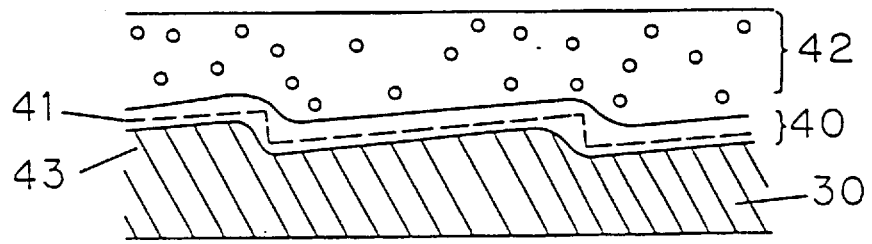

FIG. 2A shows the surface of a silicon substrate 30 used in the this example. In this example, a substrate (001) having a larger misorientation angle than the silicon substrate 10 of Example 1 is used. The misorientation angle 31 of the silicon substrate 30 is 8 degrees. A (001) clean surface shown in FIG. 2A is formed by vacuum heat cleaning or homoepitaxial growth of the silicon described above.

The surface of the silicon substrate 30 is formed of terraces 34, 35 and 36, and steps 32 and 33 defined by the misorientation angle 31.

The steps 32 and 33 on the silicon (001) surface isolates terraces 34, 35 and 36. The steps 32 and 33 run parallel to dimer arrays 37, 38 and 39 consisting of dimers of uppermost silicon atoms formed on the terraces 34, 35 and 36. Since the misorientation angle 31 is relatively large, the formed steps are step A, and each step has a height corresponding to a thickness of a two-atom layer. An interval between steps (width of the terrace) depends on the misorientation angle 31. The interval between steps (width of the terrace) is about 4.5 nm in this example. When the misorientation angle 31 is 10 degrees, the interval between steps (width of the terrace) is 1.6 nm.

Substantially no step B, running perpendicular to the dimer arrays, is present on the surface of the silicon substrate 30 of this example. Herein, it has not been observed that "step A parallel to the dimer arrays and step B perpendicular to the dimer arrays are alternately arranged, and the dimer arrays are alternately and perpendicularly present on the terraces".

After the silicon substrate 30 having a surface structure shown in FIG. 2A is prepared, the surface of the silicon substrate 30 is cleaned and then subjected to thermal oxidation. The oxidation is performed by dry oxidation. More specifically, an oxide film 40 is formed with thickness of 5 nm by heating the silicon substrate 30 to about 900° C. with a dry oxygen gas in an electric furnace. Then, the silicon substrate 10 is subjected to an annealing treatment at 950° C. in a dry nitrogen gas for 20 minutes in order to remove oxide film defects such as pin holes.

During the course of the thermal oxidation, the oxide film/silicon interface moves into the deep portion of the silicon substrate 30. In general, as the thermal oxide film becomes thick, the oxidation mechanism is changed: starting with the initial process, changing into the reaction-controlled mechanism and then the diffusion-controlled mechanism. However, in the case of this example, since the thickness of the oxide film is very thin, the formation of the oxide film is completed in the initial process.

According to this example, since the surface of the silicon substrate 30 is constructed by atomically plane surfaces, a specific path for introducing an oxidizing species is unlikely to be generated, whereas it is conventionally generated. For this reason, since the oxidizing species is uniformly reacted with a silicon atom on the surface of the silicon, irregular concaves and convexes are unlikely to be formed at the oxide film/silicon interface, compared with the conventional example.

By such thermal oxidation, the oxide film 40 having a surface profile in accordance with a step shape 41 on the surface of the silicon substrate 30 is formed before the thermal oxidation is completed. The phenomenon that the surface profile of the oxide film 40 preserves the step shape 40 of the underlying silicon is more conspicuous when the oxide film 41 becomes thinner.

Next, polysilicon 42 for functioning as a gate electrode is deposited on the oxide film 40 to form a MOS structure. When a voltage of a predetermined value is applied to the gate electrode, a thin inversion layer 43 is formed in the silicon substrate at the oxide film/silicon interface, as in the case of a conventional example.

Figure 2C:
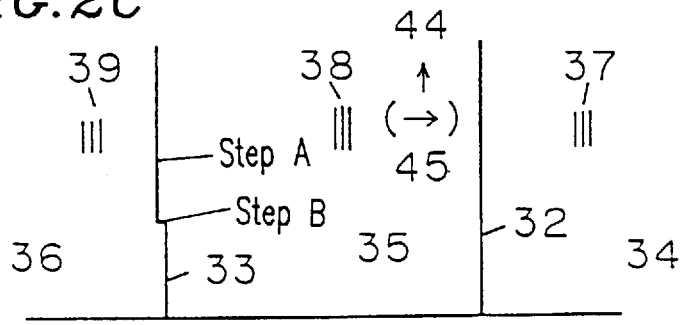

In order to produce a MOS field-effect transistor, it is necessary to form a source region, a drain region and a channel region in the vicinity of the surface of the silicon substrate 30. According to the present invention, the source region and the drain region are formed such that the traveling direction of the electrons in the inversion layer is aligned with the direction of arrow 44 shown in FIG. 2C, The source region and the drain region are not shown in FIG. 2C.

In the vicinity of the step A, the electrons travel substantially without being scattered. In addition, since no step B having a complex shape is present, there is substantially no factor to cause electrons to be scattered.

Since the height of each step corresponds to a thickness of a two-atom layer on the silicon (001) plane, a size of the concaves and convexes along the direction perpendicular to the surface of the silicon substrate (depth direction) is 0.27 nm at most.

In the case where electrons are allowed to travel in the step direction (direction of arrow 44), the electrons travel without being significantly exposed to the roughness. As a result, the scattering probability is significantly small. On the other hand, in the case where electrons are allowed to travel in the direction (direction of arrow 45) perpendicular to the step direction (direction of arrow 44), the electrons travel being exposed to the step-shaped roughness attributed to the two-atom steps. As a result, a scattering probability is larger compared with the case where the electrons travel in the step direction.

Figure 2D:
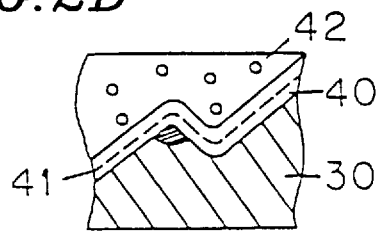
FIG. 2D is a cross sectional view illustrating a quantum fine line.

The structure shown in FIG. 2D can be obtained by subjecting the silicon surface provided with a high step to oxidation, and aligning the traveling direction of carriers in the inversion layer with the step direction. With this structure, the carriers can be trapped in a shoulder portion of the step (sharp edge), and a one-dimensional quantum fine line can be formed. This is because an electric field concentrates on the shoulder portion of the step, whereby the inversion layer is selectively formed on the shoulder portion. In order to form such a quantum fine line, it is necessary that the step has a height corresponding to about 4 to 8 atoms. A quantum fine line transistor can be produced by forming such a quantum fine line between the source region and the drain region.

As described above, according to the present invention, in arranging the source and the drain opposed thereto, a traveling direction of electrons in the inversion layer is parallel to a direction to which steps run, so that it is possible to reduce electron scattering at the silicon/oxide film interface portion. In this manner, the reduction in the mobility at the interface due to the silicon-oxide film interface roughness scattering can be suppressed under the high intensity of a vertical electric field.

Although the aforementioned description is directed to the case where a plane direction of the surface of the silicon substrate is (001), the same effects can be obtained in the case of other plane directions. In addition, the misorientation angle 31 on the substrate is preferably in the range of greater than 4 and less than 15 degrees.

EXAMPLE 3

Hereinafter, a third example of a field-effect transistor according to the present invention will be described with reference to the accompanying drawings.

Figure 3A:
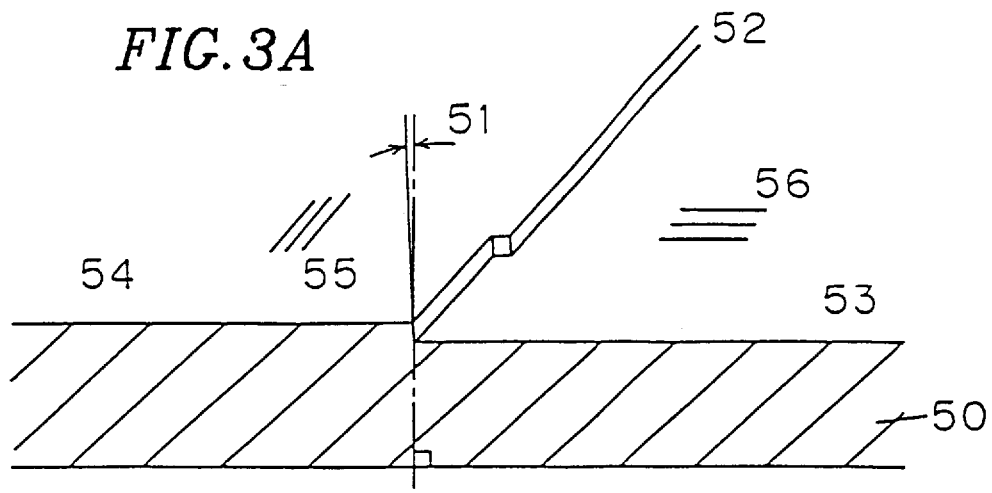
FIGS. 3A, 3B and 3C are schematic views illustrating a structure of the method for forming the hetero-interface of the metal-insulator-semiconductor field-effect transistor in the third embodiment of the present invention.
Figure 3B:
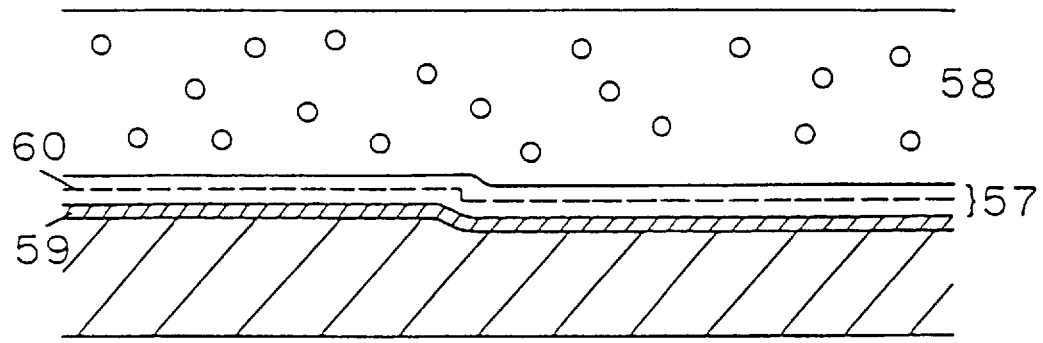
Figure 3C:
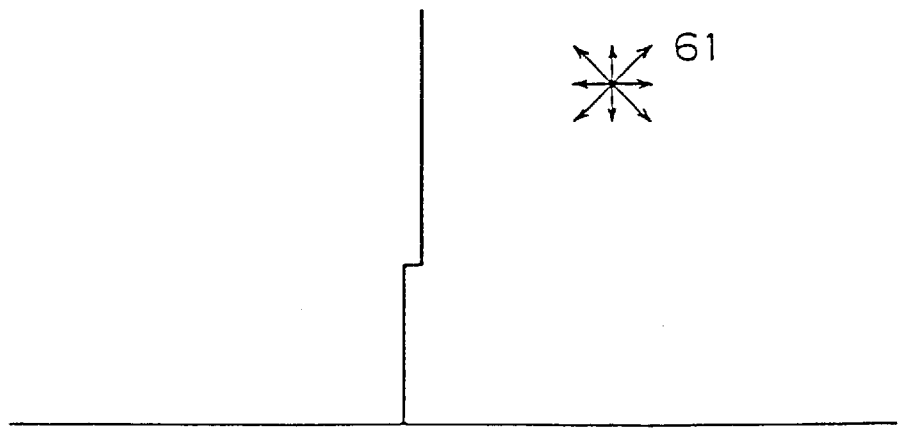
Figure 4A:
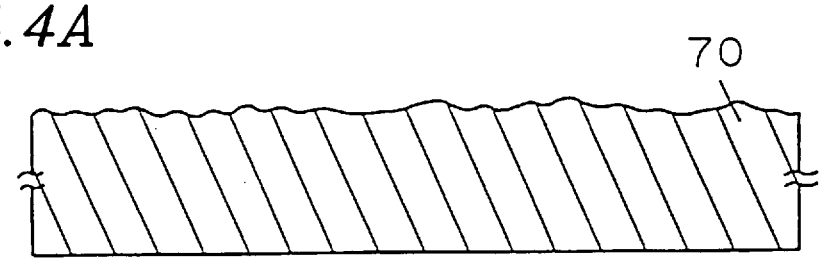
FIGS. 4A, 4B and 4C are cross sectional views illustrating treatment procedure for forming a conventional hetero-interface.
Figure 4B:
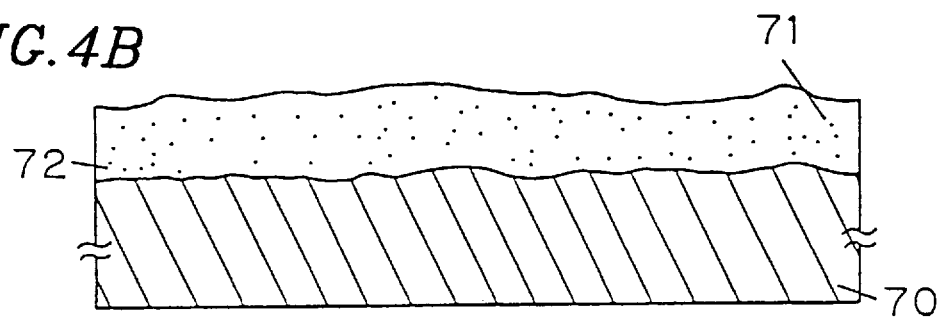
Figure 4C:
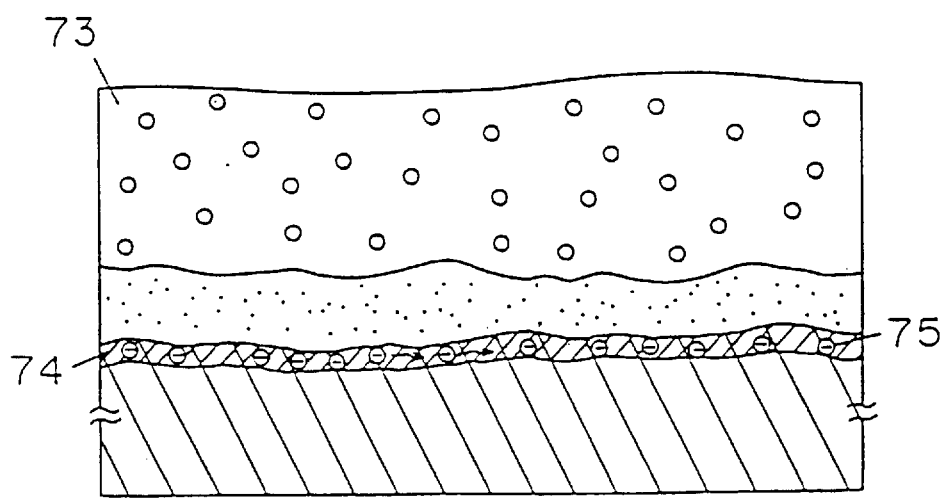

FIG. 3A shows a surface of a silicon substrate 50 used in this example. A substrate (001) having a smaller misorientation angle than the silicon substrate 10 of Example 1 is used. The misorientation angle 51 of the silicon substrate 50 is substantially zero degrees (0.2 or less). A (001) clean surface shown in FIG. 3A is formed by vacuum heat cleaning or homoepitaxial growth of silicon described above. An example of the present invention, i.e., atomically plane MOSFET will be described with reference to the accompanying drawings below.

The step 52 runs parallel to atomic arrays (dimer arrays) 55 consisting of dimers of uppermost silicon atoms formed on the terraces 54. Since the misorientation angle 51 is very small, the step 52 is not substantially present in a wide range on the surface, but step A and step B are alternately arranged. The dimer arrays 55 and 56 are alternately and perpendicularly present on the terraces. A interval between steps (width of the terrace) is about in the range of 40 nm. For this reason, in the case of a transistor having a channel length of about 100 nm or less, the number of steps which electrons encounter during movement from the source region to the drain region is at most 2 or less.

After the silicon substrate 50 having a surface structure as shown in FIG. 3A is prepared, the surface of the silicon substrate 50 is cleaned and then subjected to thermal oxidation. The oxidation is performed by dry oxidation. More specifically, an oxide film 57 is formed with thickness of 5 nm by heating the silicon substrate 50 to about 900° C. with a dry oxygen gas in an electric furnace. Then, the silicon substrate 50 is subjected to an annealing treatment at 950° C. with a dry nitrogen gas for 20 minutes in order to remove oxide film defects such as pin holes.

During the course of the thermal oxidation, the oxide film/silicon interface moves into the deep portion of the silicon substrate 50. In general, as the thermal oxide film becomes thick, the oxidation mechanism is changed: starting with the initial process, changing into the reaction-controlled mechanism and then the diffusion-controlled mechanism. However, in the case of this example, since a thickness of the oxide film 57 is very thin, the formation of the oxide film is completed in the initial process.

According to this example, since the surface of the silicon substrate 50 is constructed by atomically plane surfaces, a specific path for introducing an oxidizing species is unlikely to be generated, whereas it is conventionally generated. For this reason, since the oxidizing species is uniformly reacted with silicon atoms on the surface, irregular concaves and convexes are unlikely to be formed at the oxide film/silicon interface, compared with the conventional example.

By such thermal oxidation, the oxide film 57 having a surface profile reflecting a step shape 60 on the surface of the silicon is formed before the thermal oxidation is completed. The phenomenon that the surface profile of the oxide film 57 preserves the step shape 60 of the underlying silicon is more conspicuous when the oxide film 57 becomes thinner.

Next, polysilicon 58 for functioning as a gate electrode is deposited on the oxide film 57 to form a MOS structure. When a voltage of a predetermined value is applied to the gate electrode, a thin inversion layer 59 is formed in the silicon substrate at the oxide film/silicon interface.

In order to produce a MOS field-effect transistor, it is necessary to form a source region, a drain region and a channel region in the vicinity of the surface of the silicon substrate 50. In this example, since the misorientation angle 51 is very small, a significantly plane interface can be formed. Arrow 61 shows a traveling direction of electrons in the inversion layer 59. In this case, since substantially no step is present at the silicon-oxide film interface, the planeness of the interface is significantly excellent. Even if some steps are present, they are merely monoatomic steps (height: 0.136 nm) on the silicon (001) plane. As a result, traveling electrons are not significantly exposed to roughness due to the steps. Thus, the traveling direction of electrons does not depend on the direction of the misorientation of the substrate. Accordingly, there is no factor to cause the electrons to scatter in the vicinity of the interface. Thus, the mobility at the interface constantly registers a high value even though the source and the drains opposed thereto are formed in an arbitrary direction of the surface. Arrow 61 shows the traveling direction of electrons in the inversion layer.

As described above, in the present invention, the misorientation angle of the substrate is very small, i.e., close to zero, so that it is possible to reduce electron scattering at a silicon-oxide film interface on an arbitrary two-dimensional plane without the traveling direction of electrons in the inversion layer depending on the direction of the steps. In this manner, the reduction in the mobility at the interface due to the silicon-oxide film interface roughness scattering can be suppressed by the high intensity of a vertical electric field. Thus, a transistor using a two-dimensional electronic gas can be realized.

Although the aforementioned description is directed to the case where a plane direction of the surface of the silicon substrate is (001), needless to say, the same results can be obtained in the case of other plane directions.

EXAMPLE 4

An example of the field-effect transistor according to the present invention will be described below. In this example, a plurality of field-effect transistors are formed on one silicon substrate, and these transistors are electrically isolated from each other.

Hereinafter, a production method according to this example will be described with reference to FIGS. 6 to 10.

Figure 6:
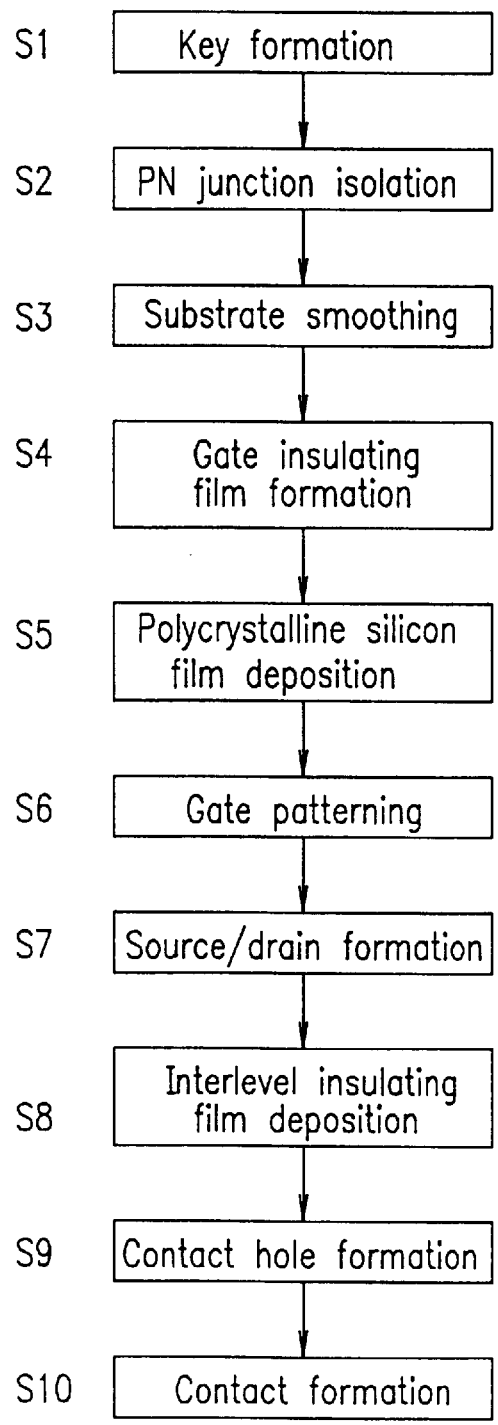
FIG. 6 is a flow chart of an embodiment of a method for producing a semiconductor apparatus of the present invention.

First, a "key" is formed on the surface of the silicon substrate at step S1 in FIG. 6. Herein, "key" is referred to as a recess having a specific shape for functioning as a mark necessary for a mask alignment. The key has a shape by which the orientation of the silicon substrate can be specified and formed in the outer periphery or the like of a chip. One example of the shape of the key can be a cross.

FIGS. 7A through 7E are cross sectional views showing a process of forming the key.

Figure 7A:
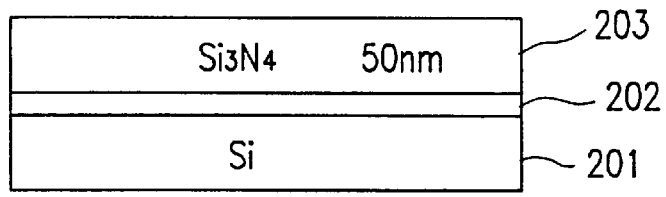
FIGS. 7A, 7B, 7C, 7D and 7E are cross sectional views illustrating a process of forming a key.

As shown in FIG. 7A, after a thermal oxide film (thickness: 25 nm) 202 is formed on a silicon substrate 201, a silicon nitride film (thickness: 50 nm) 203 is deposited on the thermal oxide film 202.

Figure 7B:
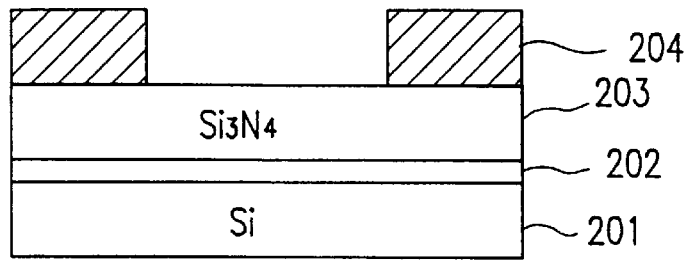

As shown in FIG. 7B, a photoresist film 204 having an opening defining the position and the shape of the key is formed on the silicon nitride film 203 by a known lithography process.

Figure 7C:
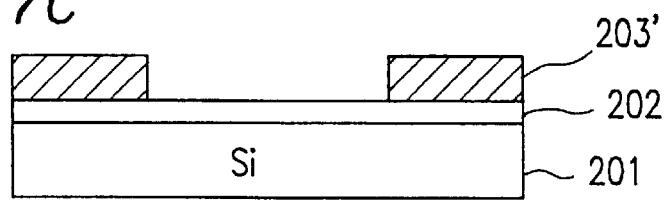
Figure 7D:
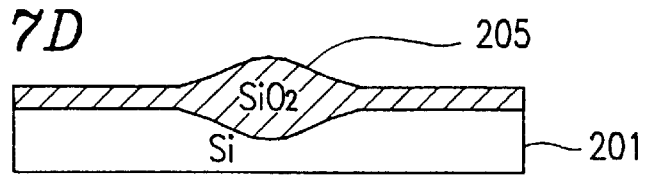

As shown in FIG. 7C, an exposed portion of the silicon nitride film 203 in the opening of the photoresist film 204 is etched to partially expose the thermal oxide film 202. Thus, a mask 203' for next local thermal oxidation is formed. After the photoresist film 204 is removed, the silicon substrate 201 with the mask 203' thereon is subjected to a thermal oxidation treatment. By this thermal oxidation treatment, a thermal oxide film 205 is grown to a thickness of 125 nm in a region where the key is to be formed, as shown in FIG. 7D.

Figure 7E:
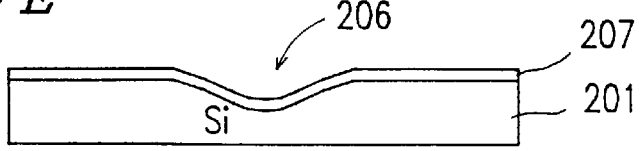

Next, as shown in FIG. 7E, the thermal oxide film 205 is completely removed to form a recess 206 (depth: 50 nm) on the silicon substrate 201. Thereafter, the silicon substrate 201 is covered with an oxide film 207 having a thickness of 10 nm.

Thus, the key forming process is completed.

Next, in order to form a CMOS transistor, a well is formed in the silicon substrate 201.

Thereafter, a PN junction isolation structure is formed at Step S2 in FIG. 6, and then the surface of the substrate is smoothed at Step S3. After a gate insulating film is formed at Step S4, a polycrystalline silicon film is deposited at Step S5. Gate patterning is performed at Step S6, and then a source region and a drain region are formed as Step S7. An interlevel insulating film is deposited at Step S8, and then a contact hole is formed in the interlevel insulating film at Step S9. At Step S10, a contact is formed.

Hereinafter, the processes of Steps S2 to S10 will be described with reference to FIGS. 8A to 8E.

Figure 8A:
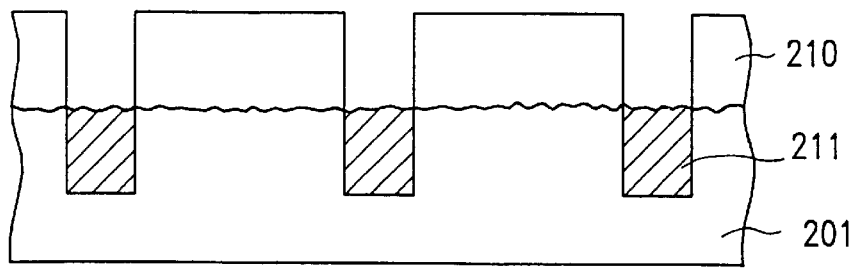
FIGS. 8A, 8B, 8C, 8D and 8E are cross sectional views illustrating a process in the embodiment of the method for producing the semiconductor apparatus of the present invention.

First, as shown in FIG. 8A, in the silicon substrate 201, regions where the source/drain and channel regions are to be formed (referred to as active regions) are selectively covered with a resist 210, and then p-type impurity ions are implanted to regions not covered with the resist 210 (referred to as isolated regions). The ion implantation is performed for the purpose of forming a p-type impurity diffusing region 211 to electrically isolate each transistor device. The implantation conditions are as follows: boron (B) ions are implanted in a dose amount of $7.5 \times 10^{12}$ cm$^{-2}$ at 180 keV, and then boron fluoride (BF$_2$) ions are implanted in a dose amount of $3.5 \times 10^{13}$ cm$^{-2}$ at 60 keV.

Figure 8B:
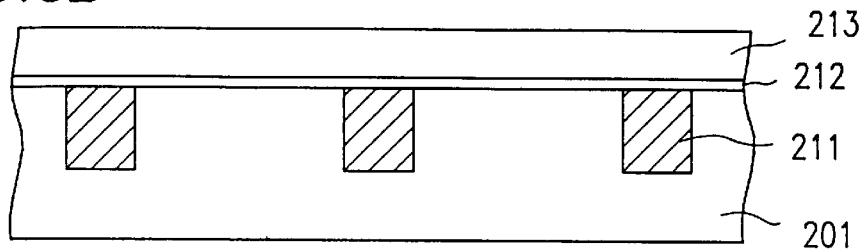
Figure 8C:
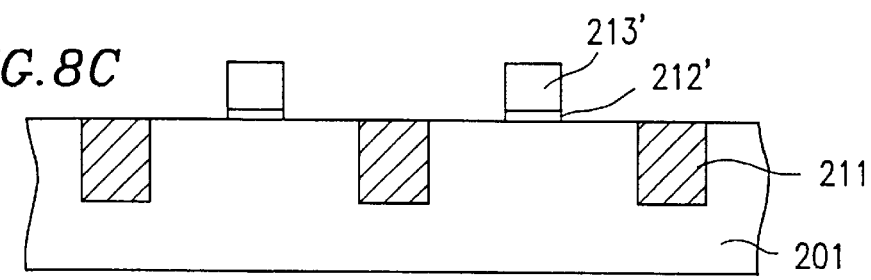
Figure 8D:
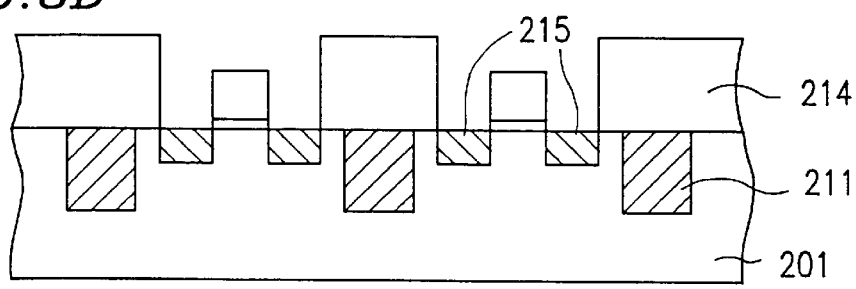
Figure 8E:
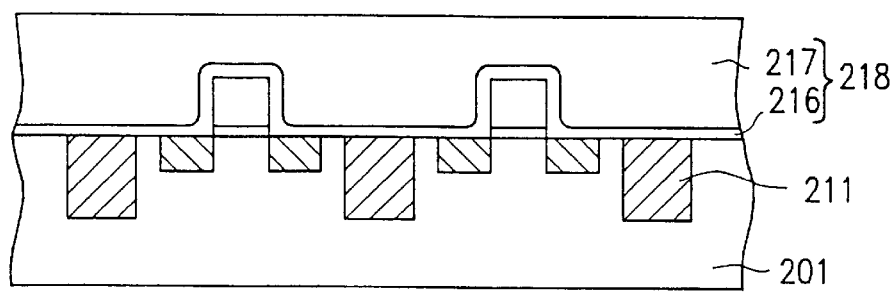

Next, the resist 210 is removed, and then the surface of the silicon substrate is smoothed by the method described in Example 1. The aforementioned key shape (not shown in FIG. 8) is preserved without being affected by the smoothing process. Thereafter, as shown in FIG. 8B, an insulating film 212 is formed by thermal oxidation, and then a polycrystalline silicon film 213 is deposited on the insulating film 212. The polycrystalline silicon film 213 and the insulating film 212 are patterned to form a gate electrode 213' located on the channel region via a gate insulating film 212'.

After a MOS structure is formed in this manner, a trench (width: 500 nm; depth: 1000 nm) for separating devices may be formed. In the case where the trench isolation is performed, it is unnecessary to perform the aforementioned p-type impurity ion implantation.

Next, a resist 214 for forming the source/drain is formed on the silicon substrate 201, and then n-type impurity ions are implanted to the silicon substrate 201 to form source/drain regions 215. Thereafter, an interlevel insulating film 218 is deposited to cover the gate electrode 213'. The interlevel insulating film 218, for example, can be obtained by forming BPSG film 217 of 700 nm on an NSG film 216 of 100 nm. The BPSG film 217 is smoothed by thermal treatment at 850° C. for 60 minutes.

Next, contact holes are formed in the interlevel insulating film 218 to reach the source/drain regions 215, and then a source/drain contact is formed by a known metallization technique.

Figure 9:
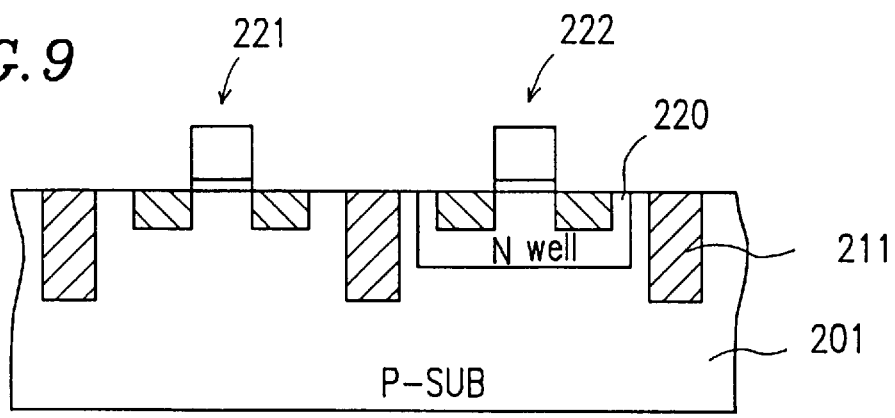
FIG. 9 is a cross sectional view illustrating a structure of a semiconductor apparatus in which an n-type MOS transistor and a p-type MOS transistor are formed on a silicon substrate.

FIG. 9 shows a schematic cross sectional configuration of a semiconductor apparatus where an n-type MOS transistor 221 and a p-type MOS transistor 222 are formed on the silicon substrate 201. The p-type MOS transistor 222 is formed on an n-type well formed in the silicon substrate 201.

Figure 10:
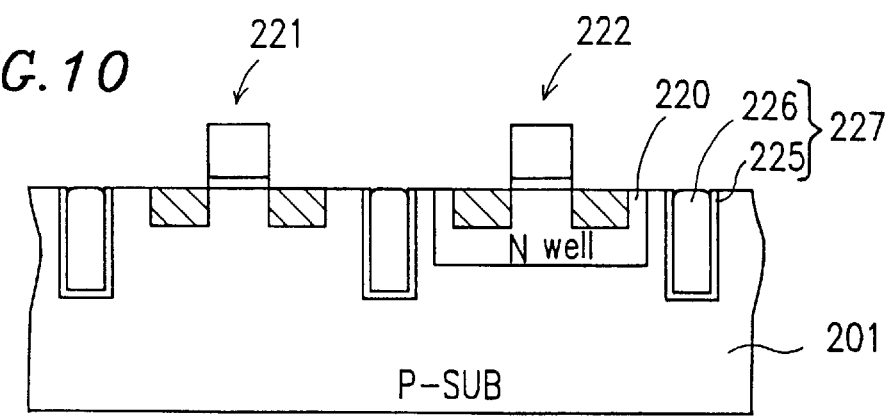
FIG. 10 is a cross sectional view illustrating a structure of a modified example of the semiconductor apparatus in FIG. 9.

FIG. 10 shows a cross sectional configuration of a modified example of the semiconductor apparatus shown in FIG. 9. The semiconductor apparatus in FIG. 10 is different from the semiconductor apparatus in FIG. 9 in that a trench isolation structure 227 is used in place of the PN junction isolation structure 211. The trench isolation structure 227 includes a groove formed on the surface of the silicon substrate 201, an oxide film 225 formed on the surface of the groove and an insulating film filling the groove.

According to the present invention, a traveling direction of electrons in an inversion layer on a (001) clean surface formed by vacuum heat cleaning or homoepitaxial growth of silicon is parallel to a direction in which the steps run. Thus, scattering at a silicon-oxide film interface can be further reduced. As a result, the reduction of mobility at the interface due to the silicon-oxide film interface roughness scattering is suppressed under the high intensity of a vertical electric field. By using the method for forming a heterointerface of an atomically plane metal-insulator-semiconductor field-effect transistor, it is possible to realize a high speed operation of a MOS device in which the reduction of scattering at the interface of traveling carriers can be suppressed, and realize a silicon quantum fine line.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A field-effect transistor comprising:
a semiconductor substrate including a source region, a drain region and a channel region located between the source and drain regions;
a gate insulating film formed on at least the channel region of the semiconductor substrate; and
a gate electrode formed on the gate insulating film;
wherein a surface of the semiconductor substrate includes a plurality of terraces having crystallographically smooth planes and at least one step located in a boundary portion of the plurality of terraces; and
the step extends substantially along a channel length direction; and
wherein 50% or more of the steps consist of a step parallel to a dimer array formed on one of the plurality of terraces.

2. A field-effect transistor comprising:
a (001) silicon substrate having a misorientation angle with a value except 0, and including a source region, a drain region and a channel region located between the source and drain regions;
a gate insulating film formed on at least the channel region of the silicon substrate; and
a gate electrode formed on the gate insulating film;
wherein a surface of the silicon substrate includes a plurality of terraces having crystallographically smooth planes and at least one step located in a boundary portion of the plurality of terraces; and
the step extends substantially along a channel length direction.

3. A field-effect transistor according to claim 2, wherein the misorientation angle is in a range greater than 0 and less than 4 degrees.

4. A field-effect transistor comprising:.
a semiconductor substrate including a source region, a drain region and a channel region located between the source and drain regions;
a gate insulating film formed on at least the channel region of the semiconductor substrate; and
a gate electrode formed on the gate insulating film;
wherein a surface of the semiconductor substrate includes a plurality of terraces having crystallographically smooth planes and at least one step located in a boundary portion of the plurality of terraces; and
the step extends substantially along a channel length direction; and
wherein dimer arrays extending in the channel length direction are formed on each of the plurality of terraces.

5. A field-effect transistor according to claim 4, wherein the step substantially consists of a step parallel to a dimer array formed on one of the plurality of terraces.

6. A field-effect transistor according to claim 5, wherein the semiconductor substrate is a (001) silicon substrate having a misorientation angle in a range of greater than 4 degrees and less than 15 degrees.

7. A field-effect transistor according to claim 6, wherein the channel region is a quantum fine line formed on a shoulder portion of the step, and a width of the quantum fine line is 10 nm or less.

8. A field-effect transistor comprising:
a semiconductor substrate including a source region, a drain region and a channel region located between the source and drain regions;
a gate insulating film formed on at least the channel region of the semiconductor substrate; and
a gate electrode formed on the gate insulating film;
wherein a surface of the semiconductor substrate includes a plurality of terraces having crystallographically smooth planes and at least one step located in a boundary portion of the plurality of terraces; and
the step extends substantially along a channel length direction; and
wherein dimer arrays are formed on an arbitrary terrace of the plurality of terraces to be orthogonal to dimer arrays formed on a terrace adjacent to the arbitrary terrace.

9. A field-effect transistor comprising:
a semiconductor substrate including a source region, a drain region and a channel region located between the source and drain regions;
a gate insulating film formed on at least the channel region of the semiconductor substrate; and
a gate electrode formed on the gate insulating film;
wherein a surface of the semiconductor substrate includes a plurality of terraces having crystallographically smooth planes and at least one step located in a boundary portion of the plurality of terraces; and
the step extends substantially along the channel length direction and changes direction at least once.

10. A field-effect transistor comprising:
a semiconductor substrate including a source region, a drain region and a channel region located between the source and drain regions;
a gate insulating film formed on at least the channel region of the semiconductor substrate; and
a gate electrode formed on the gate insulating film;
wherein a surface of the semiconductor substrate includes a plurality of terraces having crystallographically smooth planes and at least one step located in a boundary portion of the plurality of terraces; and
said step extends substantially along a channel length direction and defines at least one of a protrusion and an indentation in one of said plurality of terraces.

* * * * *

UNITED STATES PATENT AND TRADE MARK OFFICE
CERTIFICATE OF CORRECTION

PATENT NO.    : 5,886,389
DATED         : March 23, 1999
INVENTOR(S)   : Niwa

It is certified that error appears in the above-identified patent and that said Letters Patent is hereby corrected as shown below:

Cover page, item [56] References Cited, Other Publications, "J. Chung et al., "The Effects of Off-Axis Substrate Orientation on MOSFET Characteristics", Department of Electrical Engineering and Computer Sciences, University of California, pp. 26.6.4, March 12, 1989" should read -- The Effects of Off-Axis Substrate Orientation on MOSFET Characteristics", Department of Electrical Engineering and Computer Sciences, University of California, pp. 26.6.1-26.6.4, March 12, 1989 --.

Cover page, item [57] Abstract, line 7, "plural" should be --plurality--.

Signed and Sealed this

Seventh Day of September, 1999

Attest:

Q. TODD DICKINSON

Attesting Officer

Acting Commissioner of Patents and Trademarks